(12) United States Patent
Lin et al.

(10) Patent No.: US 12,080,711 B2
(45) Date of Patent: Sep. 3, 2024

(54) INDUCED SUPER-JUNCTION TRANSISTORS

(71) Applicant: NuVolta Technologies (Hefei) Co., Ltd., Hefei (CN)

(72) Inventors: John Lin, Carlsbad, CA (US); Jinbiao Huang, Nashua, NH (US)

(73) Assignee: NuVolta Technologies (Hefei) Co., Ltd., Hefei (CN)

( * ) Notice: Subject to any disclaimer, the term of this patent is extended or adjusted under 35 U.S.C. 154(b) by 360 days.

(21) Appl. No.: 17/623,531

(22) PCT Filed: Dec. 13, 2021

(86) PCT No.: PCT/CN2021/137504
§ 371 (c)(1),
(2) Date: Dec. 28, 2021

(87) PCT Pub. No.: WO2022/143125
PCT Pub. Date: Jul. 7, 2022

(65) Prior Publication Data
US 2023/0253402 A1    Aug. 10, 2023

Related U.S. Application Data

(60) Provisional application No. 63/131,658, filed on Dec. 29, 2020.

(51) Int. Cl.
*H01L 29/66*    (2006.01)
*H01L 21/265*   (2006.01)
(Continued)

(52) U.S. Cl.
CPC .... *H01L 27/0883* (2013.01); *H01L 21/26513* (2013.01); *H01L 21/8236* (2013.01);
(Continued)

(58) Field of Classification Search
CPC ........... H01L 27/0883; H01L 21/26513; H01L 21/8236; H01L 29/0653; H01L 29/1095;
(Continued)

(56) References Cited

U.S. PATENT DOCUMENTS 7,457,092 B2    11/2008    Chang et al.
9,064,958 B1 *   6/2015    Iversen ............... H01L 29/7831
(Continued)

FOREIGN PATENT DOCUMENTS

TW        485625        5/2022

OTHER PUBLICATIONS

Office Action and Search Report received in Taiwanese Application No. 110149234, dated Nov. 29, 2022, 6 pages.

*Primary Examiner* — Niki H Nguyen
(74) *Attorney, Agent, or Firm* — AP3 Law Firm PLLC (57) ABSTRACT

An apparatus includes a first drain/source region and a second drain/source region over a substrate, a first gate adjacent to the first drain/source region, the first gate comprising a plurality of first fingers forming a first comb structure, and a second gate adjacent to the second drain/source region, the second gate comprising a plurality of second fingers forming a second comb structure, wherein the plurality of first fingers and the plurality of second fingers are placed in an alternating manner, and wherein the first drain/source region, the second drain/source region, the first gate and the second gate form two back-to-back connected transistors.

19 Claims, 10 Drawing Sheets

(51) Int. Cl.
*H01L 21/8236* (2006.01)
*H01L 27/088* (2006.01)
*H01L 29/06* (2006.01)
*H01L 29/10* (2006.01)
*H01L 29/423* (2006.01)
*H01L 29/78* (2006.01)

(52) U.S. Cl.
CPC ...... *H01L 29/0653* (2013.01); *H01L 29/1095* (2013.01); *H01L 29/4238* (2013.01); *H01L 29/66681* (2013.01); *H01L 29/7816* (2013.01)

(58) Field of Classification Search
CPC ........... H01L 29/4238; H01L 29/66681; H01L 29/7816; H01L 29/41758; H01L 29/7813; H01L 29/42316; H01L 29/7786; H01L 29/4236; H01L 27/088; H01L 29/7787; H01L 2224/48247; H01L 27/0605; H01L 2924/1306; H01L 29/404; H01L 29/7802; H01L 29/7397; H01L 29/7835; H01L 23/528; H01L 24/03; H01L 27/092; H01L 29/66348; H01L 29/66333; H01L 21/28587; H01L 29/063; H01L 21/8249; H01L 29/732; H01L 27/0823; H01L 27/082; H01L 2924/1301; H01L 29/1079; H01L 27/14616; H01L 29/66318; H01L 29/7801; H01L 2027/11866; H01L 29/1075; H01L 2924/13051; H01L 29/78645; H01L 27/085
See application file for complete search history.

(56) References Cited

U.S. PATENT DOCUMENTS

| | | | | |
|---|---|---|---|---|
| 11,923,837 | B2* | 3/2024 | Lin | H01L 29/66659 |
| 2004/0164407 | A1* | 8/2004 | Nakajima | H01L 23/5227 |
| | | | | 257/E29.12 |
| 2006/0220121 | A1* | 10/2006 | Frisina | H01L 29/4983 |
| | | | | 257/341 |
| 2006/0237750 | A1* | 10/2006 | Oakes | H01L 29/4238 |
| | | | | 257/E29.12 |
| 2008/0109770 | A1* | 5/2008 | Kim | G06F 30/39 |
| | | | | 716/122 |
| 2008/0203444 | A1* | 8/2008 | Kim | H01L 29/42316 |
| | | | | 257/E29.127 |
| 2009/0108349 | A1* | 4/2009 | Kim | H01L 29/4238 |
| | | | | 257/E29.273 |
| 2010/0032754 | A1* | 2/2010 | Kawaguchi | H01L 29/66659 |
| | | | | 257/337 |
| 2010/0112770 | A1* | 5/2010 | Kubota | H01L 29/792 |
| | | | | 257/E21.409 |
| 2011/0147844 | A1* | 6/2011 | Smith | H01L 29/66575 |
| | | | | 257/E21.409 |
| 2011/0198695 | A1* | 8/2011 | Anderson | H01L 27/1211 |
| | | | | 257/E21.415 |
| 2012/0273891 | A1* | 11/2012 | Smith | H01L 29/4238 |
| | | | | 438/585 |
| 2016/0351705 | A1* | 12/2016 | Lin | H01L 29/0886 |
| 2017/0250200 | A1* | 8/2017 | Lee | H01L 29/78618 |
| 2017/0338337 | A1* | 11/2017 | Bobde | H01L 21/823481 |
| 2018/0226481 | A1* | 8/2018 | Wutte | H01L 29/7813 |
| 2021/0184034 | A1* | 6/2021 | Mehrotra | H01L 29/0882 |
| 2022/0052172 | A1* | 2/2022 | Lee | H01L 29/78642 |
| 2022/0393009 | A1* | 12/2022 | Mun | H01L 29/4238 |

* cited by examiner

INDUCED SUPER-JUNCTION TRANSISTORS

PRIORITY

This application is a national stage of International Application No. PCT/CN2021/0137504, filed on Dec. 13, 2021, which claims priority to U.S. Provisional Application No. 63/131,658, filed on Dec. 29, 2020. Both of the aforementioned applications are hereby incorporated by reference in their entireties.

TECHNICAL FIELD

The present invention relates to a reverse current protection device (e.g., a load switch), and, in particular embodiments, to a load switch including a pair of back-to-back connected transistors.

BACKGROUND

As semiconductor technologies evolve, metal oxide semiconductor field effect transistors (MOSFET) have been widely used in integrated circuits. MOSFETs are voltage controlled devices. When a control voltage is applied to the gate of a MOSFET and the control voltage is greater than the threshold of the MOSFET, a conductive channel is established between the drain and the source of the MOSFET. After the conductive channel has been established, a current flows between the drain and the source of the MOSFET. On the other hand, when the control voltage applied to the gate is less than the threshold of the MOSFET, the MOSFET is turned off accordingly.

MOSFETs may include two major categories, namely n-channel MOSFETs and p-channel MOSFETs. According to the structure difference, MOSFETs can be further divided into three sub-categories, planar MOSFETs, lateral double-diffused MOS (LDMOS) devices and vertical double-diffused MOSFETs. In comparison with other MOSFETs, the LDMOS device is capable of delivering more current per unit area because the asymmetric structure of the LDMOS device provides a short channel between the drain and the source of the LDMOS. In order to further improve the performance of the LDMOS device, a RESURF (REduced SURface Field) diffusion is placed in the drift region to increase the breakdown voltage of the LDMOS device for a given specific-on-resistance (Rsp).

As semiconductor technologies further advance, the super-junction based MOSFET has emerged to further improve key performance characteristics such as lower on-resistance and higher power conversion efficiency. In a planar MOSFET, in order to increase the voltage rating of the planar MOSFET, the drift layer becomes longer and/or the doping concentration of the drift layer is lowered. After the drift layer has become longer and the doping concentration has been lowered, the on-resistance exponentially increases. In contrast, the super-junction based MOSFET has a plurality of deep p-type pillar-like structures formed in a lightly doped n-type epitaxial layer. The plurality of deep p-type pillar-like structures and the n-type epitaxial layer form a plurality of vertical PN junctions. The plurality of vertical PN junctions helps to confine the electric field in the lightly doped n-type epitaxial layer. As a result of having the deep p-type pillar-like structures, the resistance of the n-type epitaxial layer can be reduced compared to the planar MOSFET, while maintaining the same breakdown voltage. The plurality of vertical PN junctions also helps to reduce the switching power losses through achieving unique non-linear parasitic capacitance characteristics.

A load switch is configured to connect a load to a power supply or disconnect the load from the power supply. The load switch may be controlled by an external signal. In operation, when the load switch is turned off, the load switch is able to block current from flowing in both directions. On the other hand, when the load switch is turned on, a conductive path is established between the load and the power supply. Through the conductive path, the current flows from the power supply to the load. The load switch may be implemented as an isolation switch having two back-to-back connected transistors. For a high voltage application (e.g., 24 V), each transistor may be implemented as an LDMOS device. The back-to-back connected LDMOS devices are able to achieve bidirectional current blocking.

The drawback of the existing high voltage load switch is the back-to-back connection of the LDMOS devices effectively quadruples the Rsp of the load switch because the device area and the on-resistance have been simultaneously doubled. As the semiconductor industry further advances, the load switch may be implemented on an integrated circuit. It is desirable to reduce the footprint of the load switch so as to improve the efficiency and cost of the integrated circuit.

SUMMARY

These and other problems are generally solved or circumvented, and technical advantages are generally achieved, by preferred embodiments of the present disclosure which provide a load switch including a pair of back-to-back connected transistors.

In accordance with an embodiment, an apparatus comprises a first drain/source region and a second drain/source region over a substrate, a first gate adjacent to the first drain/source region, the first gate comprising a plurality of first fingers forming a first comb structure, and a second gate adjacent to the second drain/source region, the second gate comprising a plurality of second fingers forming a second comb structure, wherein the plurality of first fingers and the plurality of second fingers are placed in an alternating manner, and wherein the first drain/source region, the second drain/source region, the first gate and the second gate form two back-to-back connected transistors.

In accordance with another embodiment, a method comprises growing an epitaxial layer with a first conductivity type on a substrate with the first conductivity type, forming a drift layer having a second conductivity type over the epitaxial layer, forming a first body region and a second body region with the first conductivity type in the drift layer, implanting ions with the second conductivity type to form a first source region in the first body region and a second source region in the second body region, forming a first gate adjacent to the first source region, wherein the first gate is of a first comb structure comprising a plurality of first fingers, and forming a second gate adjacent to the second source region, wherein the second gate is of a second comb structure comprising a plurality of second fingers.

In accordance with yet another embodiment, a load switch comprises a first transistor, and a second transistor being back-to-back connected to the first transistor, wherein a source of the first transistor and a source of the second transistor are formed over a substrate, a gate of the first transistor is adjacent to the source of the first transistor, and wherein the gate of the first transistor is of a first comb structure comprising a plurality of first fingers, and a gate of the second transistor is adjacent to the source of the second transistor, and wherein the gate of the second transistor is of a second comb structure comprising a plurality of second fingers.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a load switch including a pair of back-to-back connected lateral double-diffused metal oxide semiconductor (LDMOS) devices. The embodiments of the disclosure may also be applied, however, to a variety of reverse current protection devices formed by metal oxide semiconductor field effect transistors (MOSFETs).

Figure 1:
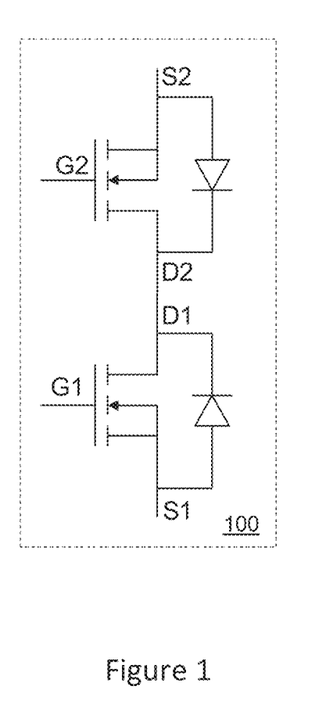
FIG. 1 illustrates a schematic diagram of shared-drain transistors in accordance with various embodiments of the present disclosure.

FIG. 1 illustrates a schematic diagram of shared-drain transistors in accordance with various embodiments of the present disclosure. A load switch may be implemented as two back-to-back connected LDMOS devices. These two LDMOS devices share a drain. Throughout the description, the load switch may be alternatively referred to as shared-drain transistors. It should be noted that the load switch shown in FIG. 1 is merely an example, which should not unduly limit the scope of the claims. One of ordinary skill in the art would recognize many variations, alternatives, and modifications. For example, the various embodiments of the present disclosure are applicable to a variety of reverse current protection devices.

As shown in FIG. 1, the shared-drain transistors 100 comprise two back-to-back connected n-type transistors. A first transistor comprises a first drain D1, a first gate G1 and a first source S1. A second transistor comprises a second drain D2, a second gate G2 and a second source S2. The drains of these two n-type transistors are directly connected to each other as shown in FIG. 1. The back-to-back connected n-type transistors shown in FIG. 1 can be used as a load switch. The load switch is able to achieve bidirectional current blocking. As such, the load switch is also known as an isolation switch.

In operation, the source of the second transistor may be connected to a high voltage potential such as a bias voltage. The source of the first transistor may be connected to a low voltage potential. In this configuration, the second switch can be turned on when the second gate is driven by a voltage higher than the high voltage potential. A charge pump may be needed to provide a gate drive voltage higher than the high voltage potential.

In some embodiments, each transistor shown in FIG. 1 may be implemented as a lateral double-diffused MOS (LDMOS). The shared-drain transistors 100 may only have four terminals, namely a first gate terminal, a first source terminal, a second gate terminal and a second source terminal. As shown in FIG. 1, the drains of the two back-to-back connected n-type transistors are connected to each other. In other words, the drain is shared by the first transistor and the second transistor. The shared drain is floating as shown in FIG. 1. As such, the shared-drain transistors 100 do not comprise a drain terminal. The layout of the shared-drain transistors 100 may be improved through removing unnecessary drain regions such as drain diffusion regions, drain contacts, drain metal regions and the like. By removing unnecessary drain regions, the two transistors shown in FIG. 1 can be brought close to each other as possible while ensuring that the two gates (G1 and G2) are separated by the minimum spacing specified by the design rule. The detailed layout of the shared-drain transistors 100 will be described below with respect to FIGS. 2-5.

Figure 2:
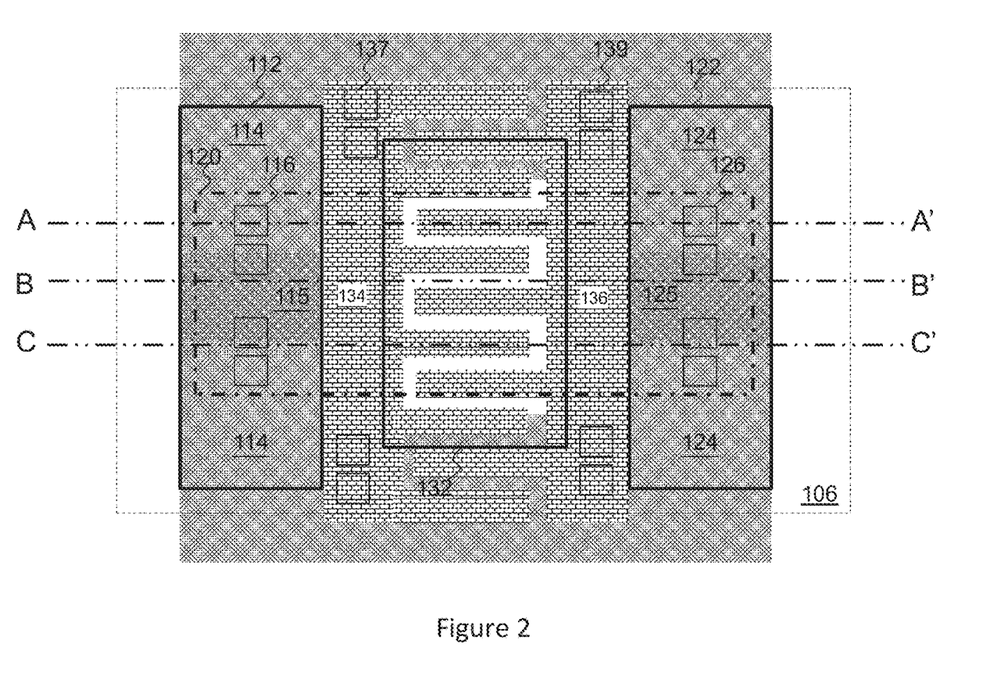
FIG. 2 illustrates a top view of a load switch formed by shared-drain LDMOS transistors in accordance with various embodiments of the present disclosure.

FIG. 2 illustrates a top view of a load switch formed by the shared-drain LDMOS transistors in accordance with various embodiments of the present disclosure. Two U-shaped N+ regions are placed adjacent to each other. On the left side, a terminal portion of the first U-shaped N+ region and a terminal portion of the second U-shaped N+ region form a first source region 114. The first source region 114 is formed within a first body region 112. Likewise, on the right side, a terminal portion of the first U-shaped N+ region and a terminal portion of the second U-shaped N+ region form a second source region 124. The second source region 124 is formed within a second body region 122.

A first P+ region 115 is formed within the first body region 112 and between two N+ regions of the first source region 114. The first P+ region 115 may contact the first p-type body region. A plurality of first source contacts 116 are formed over the first P+ region 115 and the adjacent N+ regions. At least one source contact 116 couples the first P+ region 115 to the adjacent N+ regions.

It should be noted that while on the left side, there is one P+ region 115, the semiconductor device may comprise a plurality of P+ regions 115. More particularly, depending on the design needs (e.g., more P+ regions required in response to an increased channel width), the N+ regions and the plurality of P+ regions may be formed in an alternating manner.

A second P+ region 125 is formed within the second body region 122 and between two N+ regions of the second source region 124. The second P+ region 125 may contact the second p-type body region. A plurality of second source contacts 126 are formed over the second P+ region 125 and the adjacent N+ regions. At least one source contact 126 couples the second P+ region 125 to the adjacent N+ regions.

It should be noted that while on the right side, there is one P+ region 125, the semiconductor device may comprise a plurality of P+ regions 125. More particularly, the N+ regions and the plurality of P+ regions may be formed in an alternating manner.

The high voltage oxide region 132 is placed between the first body region 112 and the second body region 122. The active region 120 of the shared-drain LDMOS transistors is orthogonal to the high voltage oxide region 132 as shown in FIG. 2.

Figure 3:
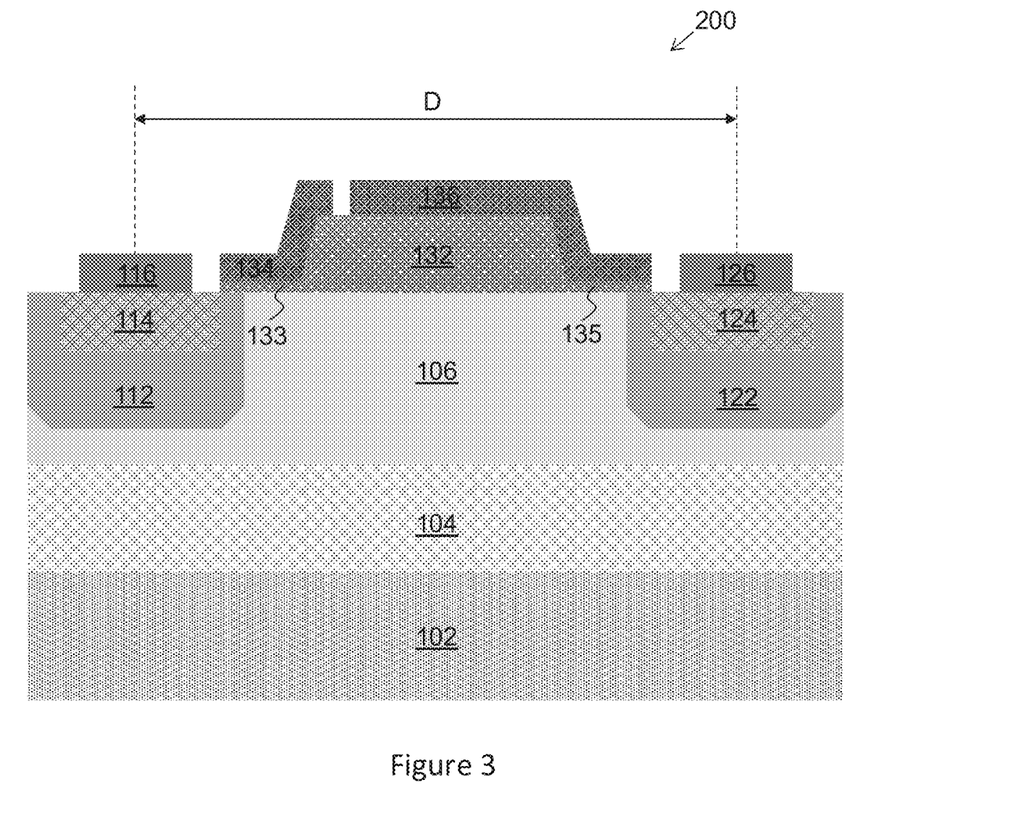
FIG. 3 illustrates a first cross-sectional view of the load switch shown in FIG. 2 in accordance with various embodiments of the present disclosure.

The first gate 134 is placed adjacent to the first source region 114. The first gate 134 has a first comb shape comprising a first shaft and a plurality of first fingers. A plurality of first gate contacts 137 is formed over the first gate 134. The second gate 136 is placed adjacent to the second source region 124. The second gate 136 has a second comb shape comprising a second shaft and a plurality of second fingers. A plurality of second gate contacts 139 is formed over the second gate 136. As shown in FIG. 3, the first gate 134 and the second gate 136 are separated from each other. The plurality of first fingers of the first gate 134 and the plurality of second fingers of the second gate 136 are placed in an alternating manner.

FIG. 2 further illustrates reference cross-sections that are used in later figures. Cross-section A-A' extends along a second finger of the second gate 136. Cross-section B-B' extends along a separation area between two adjacent fingers. Cross-section C-C' extends along a first finger of the first gate 134. Subsequent figures refer to these reference cross-sections for clarity.

FIG. 3 illustrates a first cross-sectional view of the load switch shown in FIG. 2 in accordance with various embodiments of the present disclosure. The first cross-sectional view is taken along cross-section A-A' shown in FIG. 2. The shared-drain LDMOS transistors 200 include a substrate 102, a first layer 104, a first body region 112, a second body region 122, a drift layer 106 formed over the first layer 104. The shared-drain LDMOS transistors 200 further comprise a first source region 114 formed in the first body region 112, a second source region 124 formed in the second body region 122, a first gate dielectric layer 133, a high voltage oxide region 132, a second gate dielectric layer 135, a first source contact 116, a first gate 134, a second gate 136 and a second source contact 126. Throughout the description, the first source region 114 may be alternatively referred to as a first drain/source region. The second source region 114 may be alternatively referred to as a second drain/source region.

In some embodiments, the substrate 102, the first layer 104, the first body region 112 and the second body region 122 have a first conductivity type. The drift layer 106, the first source region 114 and the second source region 124 have a second conductivity type. In some embodiments, the first conductivity type is P-type, and the second conductivity type is N-type. The shared-drain LDMOS transistors 200 are formed by two n-type transistors. Alternatively, the first conductivity type is N-type, and the second conductivity type is P-type. The shared-drain LDMOS transistors 200 are formed by two p-type transistors.

The substrate 102 may be formed of suitable semiconductor materials such as silicon, silicon germanium, silicon carbide and the like. Depending on different applications and design needs, the substrate 102 may be n-type or p-type. In some embodiments, the substrate 102 is a p-type substrate. Appropriate p-type dopants such as boron and the like are doped into the substrate 102. Alternatively, the substrate 102 is an n-type substrate. Appropriate n-type dopants such as phosphorous and the like are doped into the substrate 102.

The first layer 104 may be implemented as a P-type epitaxial layer. Throughout the description, the first layer 104 may be alternatively referred to as the P-type epitaxial layer 104. The P-type epitaxial layer 104 is grown from the substrate 102. The epitaxial growth of the P-type epitaxial layer 104 may be implemented by using any suitable semiconductor fabrication processes such as chemical vapor deposition (CVD) and the like. In some embodiments, the P-type epitaxial layer 104 is of a doping density in a range from about $10^{14}/cm^3$ to about $10^{16}/cm^3$.

The drift layer 106 is an n-type layer formed over the first layer 104. In some embodiments, the drift layer 106 may be doped with an n-type dopant such as phosphorous to a doping density of about $10^{15}/cm^3$ to about $10^{17}/cm^3$. It should be noted that other n-type dopants such as arsenic, antimony, or the like, could alternatively be used. It should further be noted that the drift layer 106 may be alternatively referred to as an extended drain region.

The first body region 112 and the second body region 122 are P-type body regions. The P-type body regions may be formed by implanting p-type doping materials such as boron and the like. Alternatively, the P-type body regions can be formed by a diffusion process. In some embodiments, a p-type material such as boron may be implanted to a doping density of about $10^{16}/cm^3$ to about $10^{18}/cm^3$. The first body region 112 may be alternatively referred to as a first channel region. The second body region 122 may be alternatively referred to as a second channel region.

The first source region 114 is a first N+ region formed in the first body region 112. The first source region 114 may be alternatively referred to as the first N+ region 114. The first source region 114 may be formed by implanting n-type dopants such as phosphorous and arsenic at a concentration of between about $10^{19}/cm^3$ and about $10^{20}/cm^3$. Furthermore, a source contact 116 is formed over the first N+ region 114.

It should be noted that a P+ region (not shown but illustrated in FIG. 2) is formed adjacent to the first N+ region 114 in the first body region 112. The P+ region may be formed by implanting a p-type dopant such as boron at a concentration of between about $10^{19}/cm^3$ and about $10^{20}/cm^3$. The P+ region may contact the p-type body. In order to eliminate the body effect, the P+ region may be connected to the first source region (the first N+ region 114) directly through the first source contact 116.

The second source region 124 is a second N+ region 124 formed in the second body region 122. The second source region 124 may be alternatively referred to as the second N+ region 124. The second source region 124 may be formed by implanting n-type dopants such as phosphorous and arsenic at a concentration of between about $10^{19}/cm^3$ and about $10^{20}/cm^3$. Furthermore, a second source contact 126 is formed over the second N+ region 124.

It should be noted that a P+ region (not shown but illustrated in FIG. 2) is formed adjacent to the second N+ region 124 in the second body region 122. The P+ region may be formed by implanting a p-type dopant such as boron at a concentration of between about $10^{19}/cm^3$ and about $10^{20}/cm^3$. The P+ region may contact the p-type body. In order to eliminate the body effect, the P+ region may be connected to the second source region (the second N+ region 124) directly through the second source contact 126.

The first gate dielectric layer 133, the high voltage oxide region 132 and the second gate dielectric layer 135 are formed over the drift layer 106. As shown in FIG. 3, the first gate dielectric layer 133 is partially on top of the first body region 112, and partially on top of the drift layer 106. Likewise, the second gate dielectric layer 135 is partially on top of the second body region 122, and partially on top of the drift layer 106. The high voltage oxide region 132 is formed between the first gate dielectric layer 133 and the second gate dielectric layer 135.

As shown in FIG. 3, the thickness of the high voltage oxide region 132 is much greater than the thickness of the first gate dielectric layer 133 and the second gate dielectric layer 135. In some embodiments, the first gate dielectric layer 133 and the second gate dielectric layer 135 are of a thickness of between about 100 Angstroms and about 200 Angstroms. The thickness of the high voltage oxide region 132 is in a range from about 1000 Angstrom to about 5000 Angstroms. In some embodiments, the first gate dielectric layer 133, the high voltage oxide region 132 and the second gate dielectric layer 135 may be formed of suitable oxide materials such as silicon oxide, silicon oxynitride, hafnium oxide, zirconium oxide or the like.

The first gate 134 is formed on the first gate dielectric layer 133 and the high voltage oxide region 132. The second gate 136 is formed on the second gate dielectric layer 135 and the high voltage oxide region 132. The first gate 134 and the second gate 136 may be formed of polysilicon, polysilicon germanium, nickel silicide or other metal, metal alloy materials.

As shown in FIG. 3, the first gate 134 extends up onto the high voltage oxide region 132. The combination of the first gate 134 and the high voltage oxide region 132 functions as a first field plate. This first field plate helps to maintain the breakdown voltage of the first transistor of the shared-drain LDMOS transistors 200. Likewise, the second gate 136 extends up onto the high voltage oxide region 132. The combination of the second gate 136 and the high voltage oxide region 132 functions as a second field plate. This second field plate helps to maintain the breakdown voltage of the second transistor of the shared-drain LDMOS transistors 200.

Referring back to FIG. 2, cross-section A-A' extends through the shaft of the comb structure of the first gate 134, and extends through the finger of the comb structure of the second gate 136. As such, the majority area over the top surface of the high voltage oxide region 132 is occupied by the second gate 136.

The first gate 134 and the second gate 136 may be formed by depositing a polysilicon layer with a thickness in a range from about 1000 Angstrom to about 4000 Angstroms over the gate dielectric layers and the high voltage oxide region, depositing a photoresist layer over the polysilicon layer, developing the photoresist layer to define the first gate 134 and the second gate 136, etching the polysilicon layer to form gates 134 and 136.

As shown in FIG. 3, the first source region 114 and the second source region 124 are arranged in a symmetrical manner with respect to a center line 101 crossing the high voltage oxide region 132.

In the conventional shared-drain LDMOS transistors, two LDMOS transistors are placed in a symmetrical manner with respect to the shared drain. Each LDMOS transistor has its own high voltage oxide region. The two high voltage oxide regions are separated by the drain contact. In accordance with the design rule of the 24 V LDMOS devices, the dimension of a single LDMOS transistor is about 2.2 um. The dimension of the two LDMOS transistors is about 4.4 um. It should be noted that the dimensions used in the previous example are selected purely for demonstration purposes and are not intended to limit the various embodiments of the present invention to any particular size dimensions. A skilled person in the art will appreciate that depending on different fabrication processes, there can be many variations of the dimension of the LDMOS.

As shown in FIG. 3, a single high voltage oxide region 132 is employed to replace the two high voltage oxide regions in the conventional shared-drain LDMOS transistors. Furthermore, the drain region and the drain contact have been removed. As a result of merging two high voltage oxide regions into one high voltage oxide region and removing the drain region and the drain contact, the two LDMOS transistors are brought close to each other. In addition, referring back to FIG. 2, the plurality of first fingers and the plurality of second fingers are placed in an alternating manner. Such an arrangement of the fingers of the first gate 134 and the second gate 136 helps to further reduce the distance between the first source contact 116 and the second source contact 126.

As shown in FIG. 3, the dimension of the shared-drain LDMOS transistors 200 is denoted as D. In particular, D is the distance between the first source contact 116 and the second source contact 126. In accordance with the design rule of the 24 V LDMOS devices, D is about 2.6 um. The dimension of the shared-drain LDMOS transistors 200 is much smaller than the dimension (4.4 um) of the conventional shared-drain LDMOS transistors.

For the shared-drain LDMOS transistors formed by 24 V LDMOS devices, the area of the shared-drain LDMOS transistors shown in FIG. 3 is about 1.18 times the area of a single transistor. Rsp is equal to an area of a semiconductor device times the on resistance of the semiconductor device. The effective Rsp is obtained through a normalization process. Based on the normalization process, the effective Rsp of a single 24 V LDMOS device is equal to 1. The comb structures of the gates shown in FIG. 2 help to reduce the on-resistance of the shared-drain LDMOS transistors 200 because the comb structures of the gates form a super-junction like transistor device. The equivalent on-resistance of this super-junction like transistor device is much less than two times the on-resistance of the single 24 V LDMOS device. According to the same normalization process, the effective Rsp of the shared-drain LDMOS transistors shown in FIG. 3 is much less than 2.36 (2 times 1.18). In the conventional device, the effective Rsp is equal to 4. As such, the shared-drain LDMOS transistors shown in FIG. 3 represent over 50% Rsp improvement relative to the conventional device.

In operation, when a first gate voltage and a second gate voltage are applied to the first gate 134 and the second gate 136, respectively, and the gate voltages are greater than the threshold of the corresponding transistors. A first inversion layer is formed in the first body region 112. The first inversion layer couples the first N+ region 114 to the drift layer 106. A second inversion layer is formed in the second body region 122. The second inversion layer couples the second N+ region 124 to the drift layer 106. As a result of having the first inversion layer and the second inversion layer, a conductive channel is established between the first source region and the second source region. A current flows between the first source region and the second source region of the shared-drain LDMOS transistors. On the other hand, when the gate voltages are less than the threshold of the transistors, the shared-drain LDMOS transistors are turned off accordingly.

Figure 4:
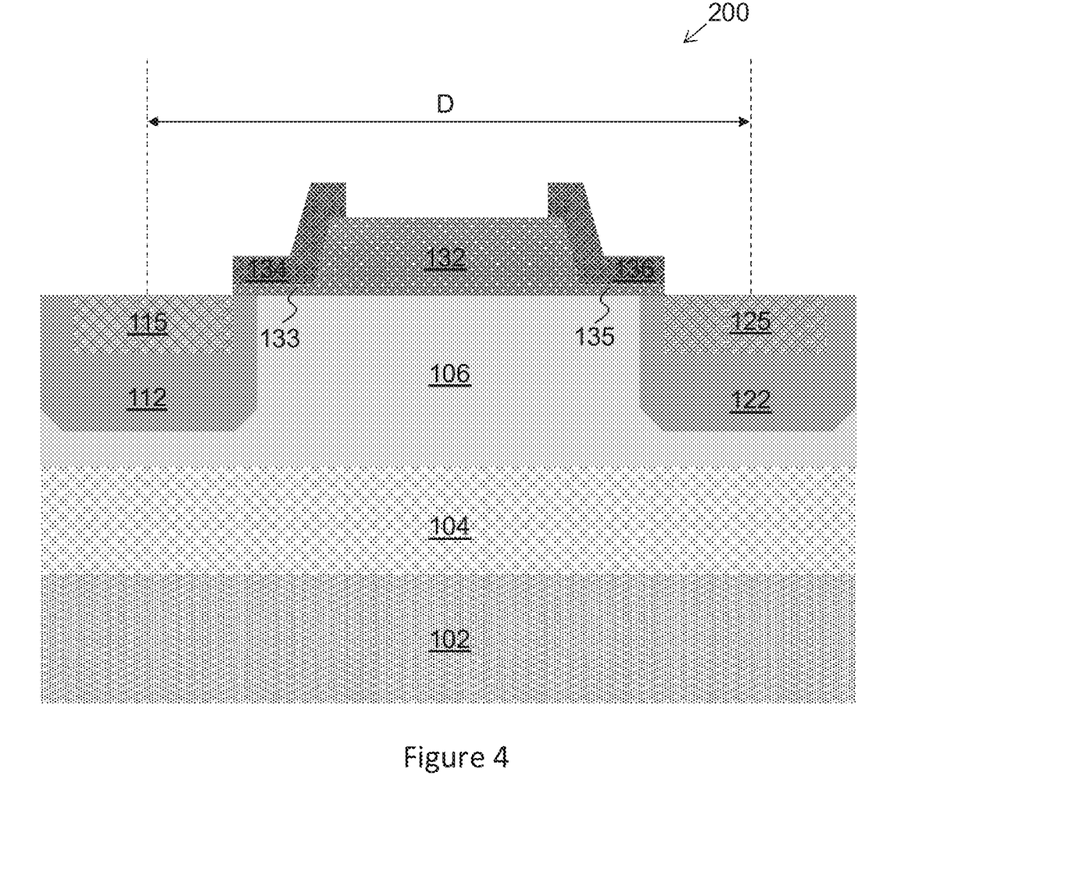
FIG. 4 illustrates a second cross-sectional view of the load switch shown in FIG. 2 in accordance with various embodiments of the present disclosure

FIG. 4 illustrates a second cross-sectional view of the load switch shown in FIG. 2 in accordance with various embodiments of the present disclosure. The second cross-sectional view is taken along cross-section B-B' shown in FIG. 2. The second cross-sectional view shown in FIG. 4 is similar to the first cross-sectional view shown in FIG. 3 except that the cross-section B-B' does not extend through the fingers of the first gate 134 and the second gate 136. As shown in FIG. 4, both the first gate 134 and the second gate 136 only occupy the edge portions of the top surface of the high voltage oxide region 132.

Figure 5:
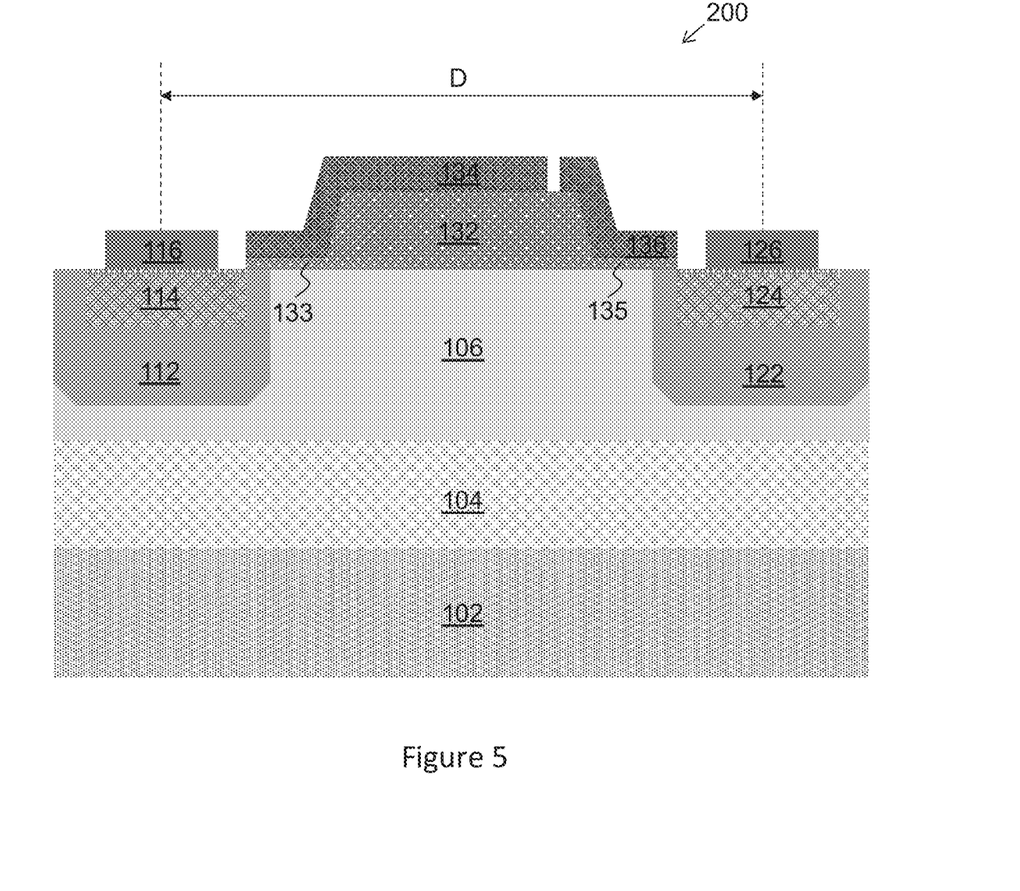
FIG. 5 illustrates a third cross-sectional view of the load switch shown in FIG. 2 in accordance with various embodiments of the present disclosure.

FIG. 5 illustrates a third cross-sectional view of the load switch shown in FIG. 2 in accordance with various embodiments of the present disclosure. The third cross-sectional view shown in FIG. 5 is similar to the first cross-sectional view shown in FIG. 3 except that the cross-section C-C' extends through the finger of the first gate 134, and extends through the shaft of the second gate 136. As shown in FIG. 5, the first gate 134 occupies the majority area of the top surface of the high voltage oxide region 132.

Figure 6:
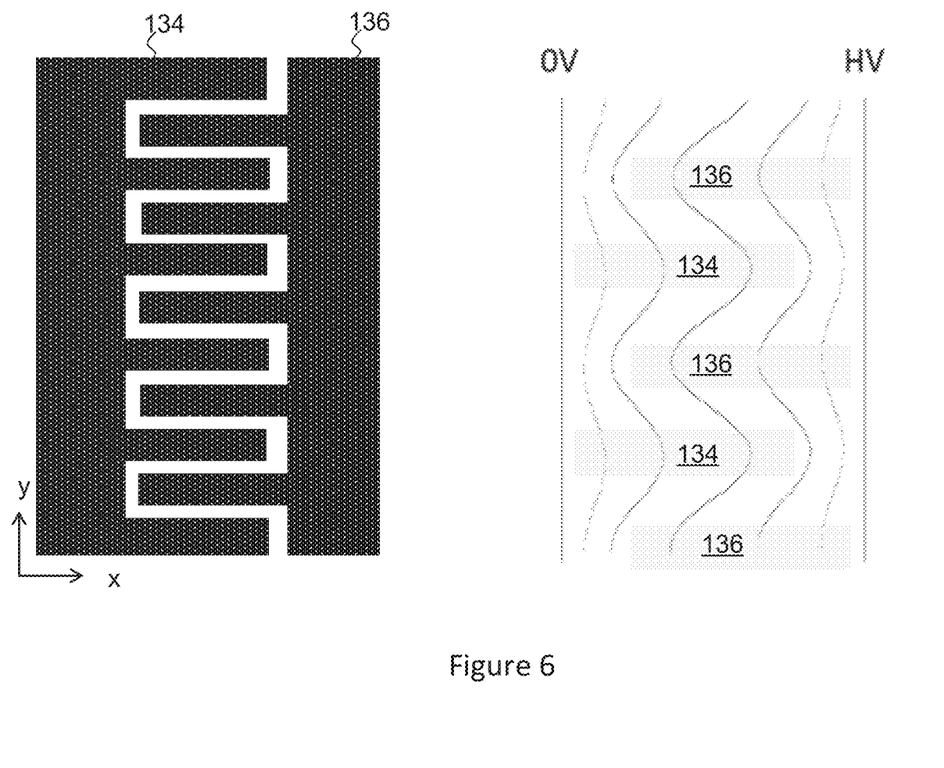
FIG. 6 illustrates a top view of a first implementation of the gate structure shown in FIG. 2 in accordance with various embodiments of the present disclosure.

FIG. 6 illustrates a top view of a first implementation of the gate structure shown in FIG. 2 in accordance with various embodiments of the present disclosure. The first gate 134 comprises a first shaft and a plurality of first fingers. The second gate 136 comprises a second shaft and a plurality of second fingers. The first shaft of the first gate 134 is in parallel with the second shaft of the second gate 136. The plurality of first fingers and the plurality of second fingers are placed in an alternating manner as shown in FIG. 6.

The LDMOS transistors shown in FIGS. 3-5 are designed using the two-dimensional (2D) RESURF principle by forming a vertical PN junction between the n-type drift layer and the p-type epitaxial layer. The gate structures shown in FIG. 6 help to obtain the 3D RESURF effect. The 3D RESURF effect helps to achieve a uniform electric field in the longitudinal source-drain direction (x direction shown in FIG. 6), and allow a periodically varying electric field in the transverse direction (y direction shown in FIG. 6). It should be noted z direction described below is a direction orthogonal to a plane formed by x and y directions. The electric field satisfies the Poisson equation:

$$\frac{\partial E_x}{\partial x} + \frac{\partial E_y}{\partial y} + \frac{\partial E_z}{\partial z} = \frac{q}{\epsilon_{si}}(N_d - n) \qquad (1)$$

In Equation (1), $E_x$, $E_y$ and $E_z$ are the x, y and z components of the electric field; q is the electronic charge; $\epsilon_{si}$ is silicon's permittivity; $N_d$ is the doping concentration in the floating drift region; n is the electron concentration.

The periodically varying electric field in the transverse direction can be created by the comb structures of the first gate 134 and the second gate 136. The first gate 134 and the second gate 136 are gates of the load switch coupled between a high voltage (HV) and ground (0 V). When both transistors are turned off, the first gate voltage (first gate 134) and the first source voltage (source 114) are equal to 0 V. The second gate voltage (second gate 136) and the second source voltage (source 124) are equal to HV. The floating drift layer swings between 0 V and HV as shown in FIG. 6. The comb fingers of the first gate 134 are configured to produce a plurality of depletion regions in the drift layer. The comb fingers of the second gate 136 are configured to produce a plurality of accumulation layers in the drift layer. The depletion regions and the accumulation layers form alternating oppositely charged columns in the drift layer. Such alternating oppositely charged columns create a super-junction like structure allowing maximizing the $$\frac{\partial E_y}{\partial y}$$

term in Equation (1). The maximized $$\frac{\partial E_y}{\partial y}$$

term can further enhance the RESURF action in the x direction.

After having the 3D RESURF structure, the electric field $E_x$ in the x direction becomes nearly uniform. The breakdown voltage can be calculated according to the following equation:

$$BV = E_{cr} \times \left(\frac{p}{2}\right) \qquad (2)$$

In Equation (2), BV is the breakdown voltage; $E_{cr}$ is the critical electric field at the breakdown point; p is the device pitch (the distance between two sources of the load switch). The 3D RESURF structure can improve the breakdown voltage. More particularly, the 3D RESURF structure helps to improve the breakdown voltage of the shared-drain LDMOS transistors when the shared-drain LDMOS transistors are in the off-state. In some embodiments, the shared-drain LDMOS transistors are formed by 24 V LDMOS devices. Without having the comb structures, the breakdown voltage is about 37 V. After having the comb structures shown in FIG. 6, the breakdown voltage is about 56 V.

Figure 7:
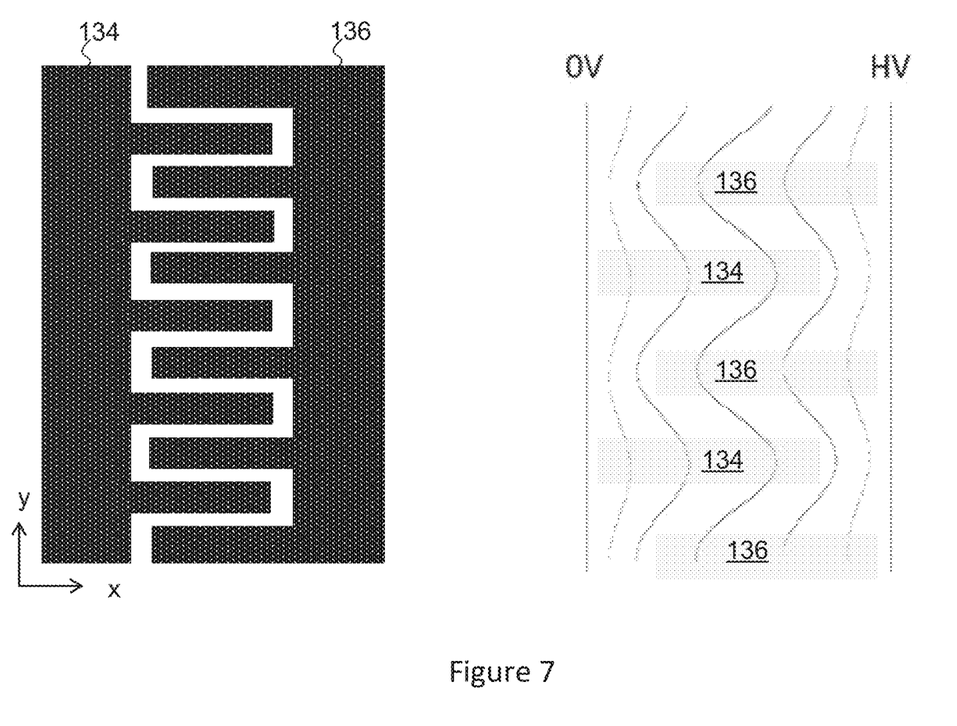
FIG. 7 illustrates a top view of a second implementation of the gate structure shown in FIG. 2 in accordance with various embodiments of the present disclosure.

FIG. 7 illustrates a top view of a second implementation of the gate structure shown in FIG. 2 in accordance with various embodiments of the present disclosure. The second implementation shown in FIG. 7 is similar to that shown in FIG. 6 except that the outermost fingers are the fingers of the second gate 136.

Figure 8:
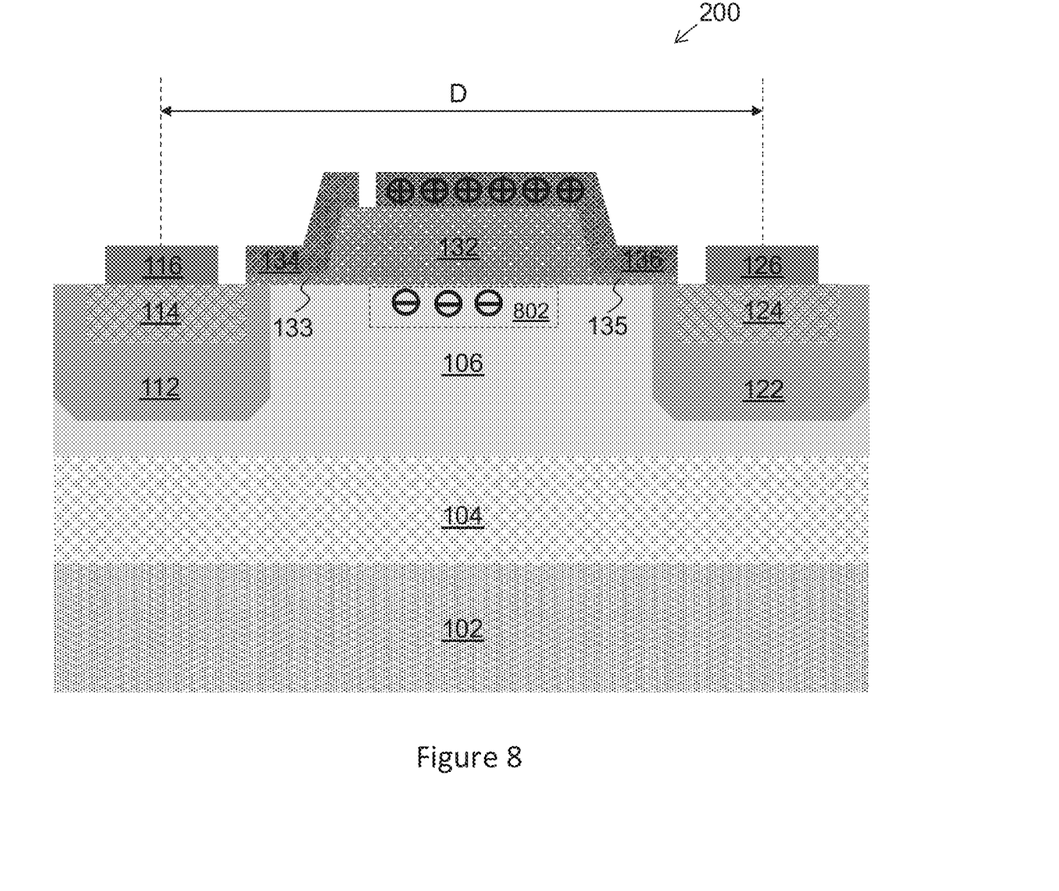
FIG. 8 illustrates a cross-sectional view of the load switch shown in FIG. 2 after an accumulation layer is formed in the drift layer in accordance with various embodiments of the present disclosure.

FIG. 8 illustrates a cross-sectional view of the load switch shown in FIG. 2 after an accumulation layer is formed in the drift layer in accordance with various embodiments of the present disclosure. The cross-sectional view of FIG. 8 is similar to that shown in FIG. 3 except that a high gate drive voltage is applied to the second gate 136. In some embodiments, the high gate drive voltage is about 20 V. In response to the high gate drive voltage, the positive charge is generated on the second gate 136. The positive charge on the second gate 136 attracts electrons to form an accumulation layer 802 as shown in FIG. 8.

Figure 9:
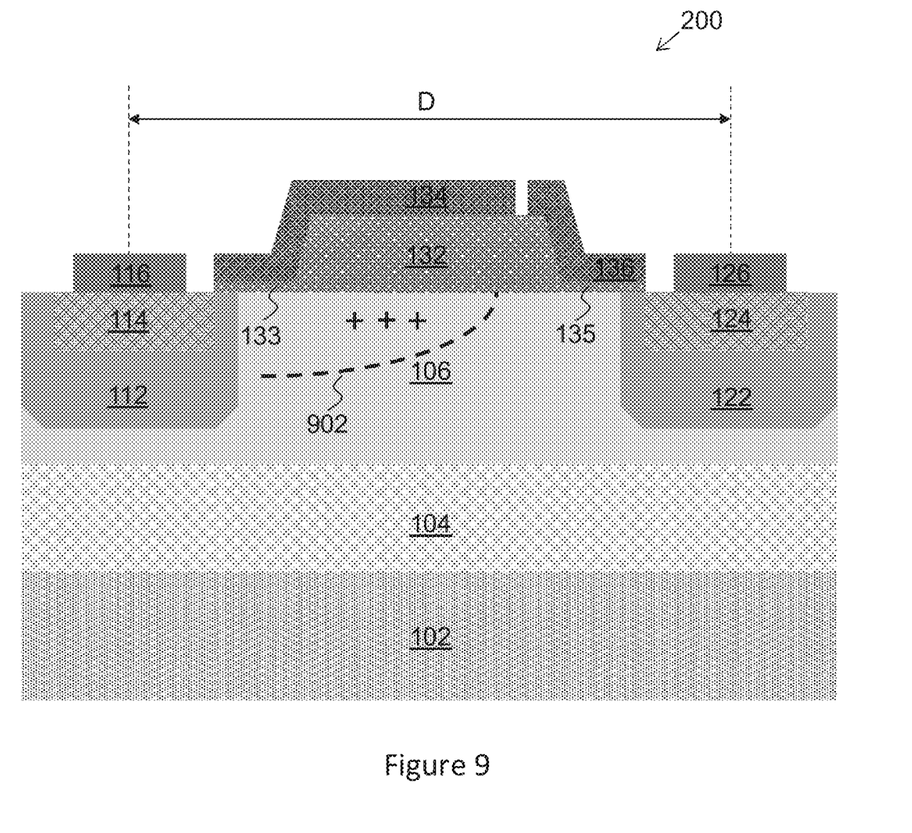
FIG. 9 illustrates a cross-sectional view of the load switch shown in FIG. 2 after a depletion region is formed in the drift layer in accordance with various embodiments of the present disclosure.

FIG. 9 illustrates a cross-sectional view of the load switch shown in FIG. 2 after a depletion region is formed in the drift layer in accordance with various embodiments of the present disclosure. The cross-sectional view of FIG. 9 is similar to that shown in FIG. 5 except that a low gate drive voltage is applied to the first gate 134. In some embodiments, the low gate drive voltage is about 0 V. In addition, a high gate drive voltage is applied to the second gate 136. In response to the low gate drive voltage applied to the first gate 134 and the high gate drive voltage applied to the second gate 136, the electrons are depleted and the ionized donors form a positively charged depletion region 902 under the first gate 134.

The accumulation layer 802 shown in FIG. 8 functions as an n-type column. The depletion region 902 shown in FIG. 9 functions as a p-type column. Referring back to FIG. 7, the comb fingers of the first gate 134 are configured to produce a plurality of depletion regions (e.g., depletion region 902 shown in FIG. 9) in the drift layer. The comb fingers of the second gate 136 are configured to produce a plurality of accumulation layers (e.g., accumulation layer 802 shown in FIG. 8) in the drift layer. The depletion regions and the accumulation layers form alternating oppositely charged columns (p-type columns and n-type columns) in the drift layer. Such alternating oppositely charged columns create an induced super-junction transistor structure.

Figure 10:
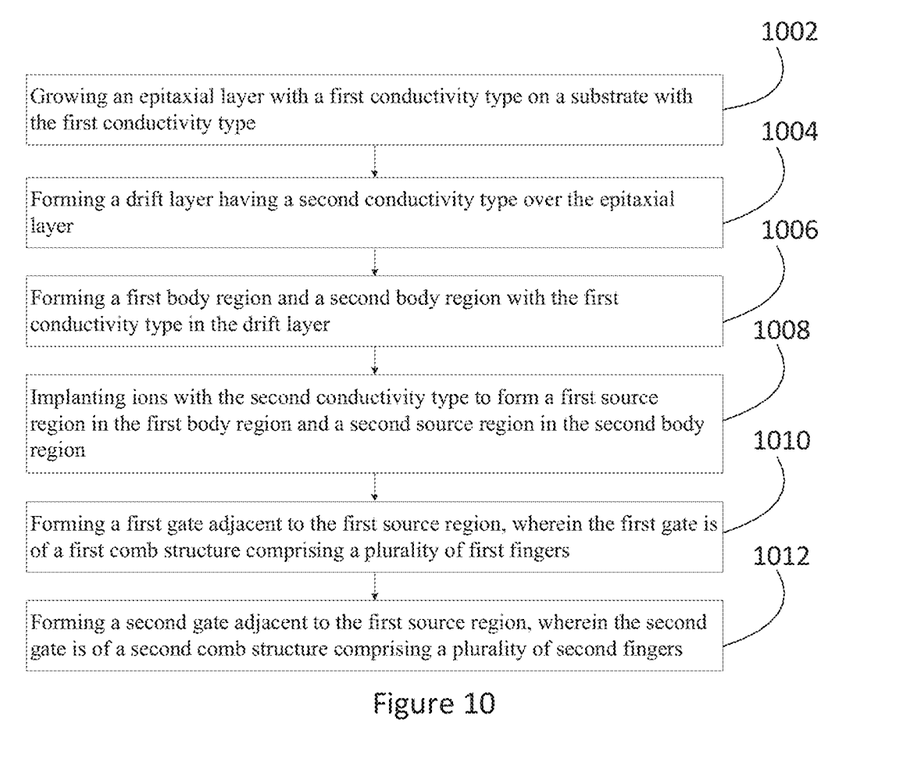
FIG. 10 illustrates a flow chart of forming the load switch shown in FIG. 1 in accordance with various embodiments of the present disclosure.

FIG. 10 illustrates a flow chart of forming the load switch shown in FIG. 1 in accordance with various embodiments of the present disclosure. This flowchart shown in FIG. 10 is merely an example, which should not unduly limit the scope of the claims. One of ordinary skill in the art would recognize many variations, alternatives, and modifications. For example, various steps illustrated in FIG. 10 may be added, removed, replaced, rearranged and repeated.

Referring back to FIGS. 1-2, a load switch comprises a first transistor and a second transistor. The second transistor is back-to-back connected to the first transistor. A source of the first transistor and a source of the second transistor are formed over a substrate. A gate of the first transistor is adjacent to the source of the first transistor. The gate of the first transistor is of a first comb structure comprising a plurality of first fingers. A gate of the second transistor is adjacent to the source of the second transistor. The gate of the second transistor is of a second comb structure comprising a plurality of second fingers.

The load switch further comprises an epitaxial layer over the substrate, a drift layer over the epitaxial layer, a first body region and a second body region in the drift layer, and a high voltage oxide region over the drift layer. The plurality of first fingers and the plurality of second fingers are placed in an alternating manner over the high voltage oxide region.

At step 1002, an epitaxial layer is grown with a first conductivity type on a substrate with the first conductivity type.

At step 1004, a drift layer having a second conductivity type is formed over the epitaxial layer. In some embodiments, the first conductivity type is p-type. The second conductivity type is n-type.

At step 1006, a first gate and a second gate are formed over the substrate. The first gate is of a first comb structure comprising a plurality of first fingers. The second gate is of a second comb structure comprising a plurality of second fingers.

At step 1008, a first body region and a second body region with the first conductivity type are formed in the drift layer.

At step 1010, ions with the second conductivity type are implanted in the first body region and the second body region to form a first source region and a second source region, respectively.

Referring to FIG. 2, the method further comprises configuring the first gate and the second gate such that the plurality of first fingers and the plurality of second fingers are placed in an alternating manner.

Referring to FIG. 2, the method further comprises forming a high voltage oxide region over the drift layer, forming a gate dielectric layer from an edge of the first source region to an edge of the second source region, forming the first gate along an edge of the first source region, wherein the first gate covers a first sidewall and a first edge portion of the high voltage oxide region, and forming the second gate along an edge of the second source region, wherein the second gate covers a second sidewall and a second edge portion of the high voltage oxide region.

Referring to FIGS. 8-9, the method further comprises forming a plurality of accumulation layers in the drift layer through applying a high gate drive voltage to the plurality of second fingers of the second gate, and forming a plurality of depletion regions in the drift layer through applying a low gate drive voltage to the plurality of first fingers of the first gate. The plurality of depletion regions and the plurality of accumulation layers form alternating oppositely charged columns in the drift layer, and wherein the alternating oppositely charged columns form an induced super-junction transistor structure.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a first drain/source region and a second drain/source region over a substrate;
a first gate adjacent to the first drain/source region, the first gate comprising a plurality of first fingers forming a first comb structure; and
a second gate adjacent to the second drain/source region, the second gate comprising a plurality of second fingers forming a second comb structure, wherein the plurality of first fingers and the plurality of second fingers are placed in an alternating manner, and wherein the first drain/source region, the second drain/source region, the first gate and the second gate form two back-to-back connected transistors.

2. The apparatus of claim 1, wherein:
the first drain/source region is a first source of the two back-to-back connected transistors; and
the second drain/source region is a second source of the two back-to-back connected transistors.

3. The apparatus of claim 1, further comprising:
an epitaxial layer having a first conductivity type over the substrate having the first conductivity type;
a drift layer having a second conductivity type over the epitaxial layer;
a first body region having the first conductivity type formed in the drift layer, wherein the first drain/source region is formed in the first body region and has the second conductivity type;
a second body region having the first conductivity type formed in the drift layer, wherein the second drain/source region is formed in the second body region and has the second conductivity type;
a high voltage oxide region over the drift layer;
a first gate dielectric layer formed between the high voltage oxide region and the first drain/source region; and
a second gate dielectric layer formed between the high voltage oxide region and the second drain/source region.

4. The apparatus of claim 3, wherein:
the first conductivity type is p-type; and
the second conductivity type is n-type.

5. The apparatus of claim 3, wherein:
the first drain/source region and the second drain/source region are arranged in a symmetrical manner with respect to a center line crossing the high voltage oxide region.

6. The apparatus of claim 1, wherein:
after the two back-to-back connected transistors are turned off, the plurality of first fingers is configured to produce a plurality of depletion regions, and the plurality of second fingers is configured to produce a plurality of accumulation layers.

7. The apparatus of claim 6, wherein:
the plurality of depletion regions and the plurality of accumulation layers are formed in an alternating manner.

8. The apparatus of claim 1, wherein:
after the two back-to-back connected transistors are turned off, the plurality of first fingers has a first voltage potential, and the plurality of second fingers has a second voltage potential higher than the first voltage potential.

9. The apparatus of claim 8, wherein:
the plurality of first fingers and the plurality of second fingers are alternating oppositely charged, and wherein the alternating oppositely charged first fingers and second fingers form a super-junction structure.

10. A method comprising:
growing an epitaxial layer with a first conductivity type on a substrate with the first conductivity type;
forming a drift layer having a second conductivity type over the epitaxial layer;
forming a first body region and a second body region with the first conductivity type in the drift layer;
implanting ions with the second conductivity type to form a first source region in the first body region and a second source region in the second body region;
forming a first gate adjacent to the first source region, wherein the first gate is of a first comb structure comprising a plurality of first fingers; and
forming a second gate adjacent to the second source region, wherein the second gate is of a second comb structure comprising a plurality of second fingers.

11. The method of claim 10, further comprising:
configuring the first gate and the second gate such that the plurality of first fingers and the plurality of second fingers are placed in an alternating manner.

12. The method of claim 10, further comprising:
forming a high voltage oxide region over the drift layer;
forming a gate dielectric layer from an edge of the first source region to an edge of the second source region;
forming the first gate along an edge of the first source region, wherein the first gate covers a first sidewall and a first edge portion of the high voltage oxide region; and
forming the second gate along an edge of the second source region, wherein the second gate covers a second sidewall and a second edge portion of the high voltage oxide region.

13. The method of claim 10, wherein:
the first source region, the second source region, the first gate and the second gate form two back-to-back connected transistors.

14. The method of claim 10, further comprising:
forming a plurality of accumulation layers in the drift layer through applying a high gate drive voltage to the plurality of second fingers of the second gate; and
forming a plurality of depletion regions in the drift layer through applying a low gate drive voltage to the plurality of first fingers of the first gate.

15. The method of claim 14, wherein:
the plurality of depletion regions and the plurality of accumulation layers form alternating oppositely charged columns in the drift layer, and wherein the alternating oppositely charged columns form an induced super-junction transistor structure.

16. A load switch comprising:
a first transistor; and
a second transistor being back-to-back connected to the first transistor, wherein:
a source of the first transistor and a source of the second transistor are formed over a substrate;
a gate of the first transistor is adjacent to the source of the first transistor, and wherein the gate of the first transistor is of a first comb structure comprising a plurality of first fingers; and
a gate of the second transistor is adjacent to the source of the second transistor, and wherein the gate of the second transistor is of a second comb structure comprising a plurality of second fingers.

17. The load switch of claim 16, further comprising:
an epitaxial layer over the substrate;
a drift layer over the epitaxial layer;
a first body region and a second body region in the drift layer; and
a high voltage oxide region over the drift layer, wherein the plurality of first fingers and the plurality of second fingers are placed in an alternating manner over the high voltage oxide region.

18. The load switch of claim 17, further comprising:
a plurality of accumulation layers in the drift layer through applying a high gate drive voltage to the plurality of second fingers of the second gate; and
a plurality of depletion regions in the drift layer through applying a low gate drive voltage to the plurality of first fingers of the first gate.

19. The load switch of claim 18, further comprising:
the plurality of depletion regions and the plurality of accumulation layers form an induced super-junction transistor structure.

* * * * *